United States Patent
Chung et al.

(10) Patent No.: US 9,165,916 B2
(45) Date of Patent: Oct. 20, 2015

(54) SEMICONDUCTOR PACKAGE AND METHOD OF FABRICATING THE SAME

(71) Applicant: Samsung Electronics Co., Ltd, Suwon-si, Gyeonggi-do (KR)

(72) Inventors: Hyunsoo Chung, Hwaseong-si (KR); Seungduk Baek, Hwaseong-si (KR); In-Young Lee, Yongin-si (KR); Tae-Je Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/326,631

(22) Filed: Jul. 9, 2014

(65) Prior Publication Data

US 2015/0102505 A1 Apr. 16, 2015

(30) Foreign Application Priority Data

Oct. 16, 2013 (KR) .................. 10-2013-0123444

(51) Int. Cl.
*H01L 21/44* (2006.01)
*H01L 21/48* (2006.01)
(Continued)

(52) U.S. Cl.
CPC .............. *H01L 25/50* (2013.01); *H01L 21/563* (2013.01); *H01L 23/295* (2013.01); *H01L 23/3135* (2013.01); *H01L 23/481* (2013.01); *H01L 24/94* (2013.01); *H01L 24/97* (2013.01); *H01L 25/0657* (2013.01); *H01L 23/3128* (2013.01); *H01L 24/05* (2013.01); *H01L 24/06* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/0401* (2013.01); *H01L 2224/0557* (2013.01); *H01L 2224/06181* (2013.01); *H01L 2224/131* (2013.01); *H01L 2224/16146* (2013.01); *H01L 2224/16225* (2013.01); *H01L 2224/32145* (2013.01); *H01L 2224/32225* (2013.01); *H01L 2224/73104* (2013.01); *H01L 2224/73204* (2013.01); *H01L 2224/81005* (2013.01); *H01L 2224/81815* (2013.01); *H01L 2224/83191* (2013.01); *H01L 2224/83192* (2013.01); *H01L 2224/92125* (2013.01); *H01L 2224/94* (2013.01); *H01L 2224/97* (2013.01);
(Continued)

(58) Field of Classification Search
CPC ........................... H01L 23/481; H01L 21/563
USPC .......... 438/108, 109, 127; 257/777, E23.116, 257/E21.499
See application file for complete search history.

(56) References Cited

U.S. PATENT DOCUMENTS 7,737,552 B2 * 6/2010 Beyne .......................... 257/724
7,816,181 B1 10/2010 Bhagath et al.
(Continued)

OTHER PUBLICATIONS

Ahmer Syed, Emerging IC Packaging Technologies, VP—Mechanical Engineering, Dec. 2012, pp. 1-37.
(Continued)

*Primary Examiner* — Nitin Parekh
(74) *Attorney, Agent, or Firm* — Ellsworth IP Group PLLC (57) ABSTRACT

A semiconductor package and a method of fabricating the same. The method may include mounting a lower stack including a plurality of lower semiconductor chips on a substrate and mounting an upper stack including a plurality of upper semiconductor chips on the lower stack. According to example embodiments of the inventive concept, the semiconductor package can be easily fabricated.

13 Claims, 7 Drawing Sheets

(51) Int. Cl.
*H01L 25/00* (2006.01)
*H01L 25/065* (2006.01)
*H01L 23/48* (2006.01)
*H01L 23/29* (2006.01)
*H01L 21/56* (2006.01)
*H01L 23/00* (2006.01)
*H01L 23/31* (2006.01)

(52) U.S. Cl.
CPC .......... *H01L 2225/06513* (2013.01); *H01L 2225/06517* (2013.01); *H01L 2225/06541* (2013.01); *H01L 2225/06565* (2013.01); *H01L 2924/15311* (2013.01)

(56) References Cited

U.S. PATENT DOCUMENTS

| | | | |
|---|---|---|---|
| 8,017,439 B2 | 9/2011 | Takahashi et al. | |
| 8,227,295 B2 | 7/2012 | Simmons-Matthews et al. | |
| 8,232,140 B2 | 7/2012 | Yang et al. | |
| 8,253,232 B2 * | 8/2012 | Kim et al. | 257/686 |
| 8,274,143 B2 * | 9/2012 | Fujishima et al. | 257/686 |
| 8,338,232 B2 | 12/2012 | Shi et al. | |
| 8,470,641 B2 | 6/2013 | Takahashi | |
| 8,531,015 B2 | 9/2013 | Marimuthu et al. | |
| 8,597,981 B2 * | 12/2013 | Lake | 438/107 |
| 8,703,534 B2 * | 4/2014 | Toh et al. | 438/106 |
| 2004/0145044 A1 * | 7/2004 | Sugaya et al. | 257/698 |
| 2006/0073637 A1 * | 4/2006 | Yokoyama et al. | 438/109 |
| 2008/0094793 A1 * | 4/2008 | Sakurai et al. | 361/684 |
| 2008/0230913 A1 | 9/2008 | Huang et al. | |
| 2010/0109169 A1 * | 5/2010 | Kolan et al. | 257/787 |
| 2010/0190294 A1 | 7/2010 | Simmons-Matthews | |
| 2010/0261311 A1 * | 10/2010 | Tsuji | 438/109 |
| 2012/0074581 A1 | 3/2012 | Guzek et al. | |
| 2012/0142165 A1 | 6/2012 | Huang et al. | |
| 2013/0026643 A1 * | 1/2013 | England et al. | 257/774 |
| 2013/0032947 A1 | 2/2013 | Park et al. | |
| 2013/0082399 A1 | 4/2013 | Kim et al. | |
| 2013/0137216 A1 * | 5/2013 | Ito et al. | 438/108 |

OTHER PUBLICATIONS

Minsuk. Suh, Key Technology Challenges for Wide I/O Application and SK Hynix Approach, Jun. 22, 2012, pp. 1-21.

* cited by examiner

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0123444, filed on Oct. 16, 2013, in the Korean Intellectual Property Office, the entire contents of which are hereby incorporated by reference.

BACKGROUND OF THE INVENTION

1. Field of the Invention

Example embodiments of the inventive concept relate to a semiconductor device, and in particular, to a multichip semiconductor package with through vias.

2. Description of the Related Art

Advances in electronic industry have provided light, small, fast electronic products at competitive prices. For the use in electronic devices, an integrated circuit chip may be provided in the form of a semiconductor package. A variety of researches have been intensively conducted to improve performance of the semiconductor package. Especially, a through-silicon via (TSV) technology is being developed to replace the conventional wire bonding technology in the field of the semiconductor package.

SUMMARY OF THE INVENTION

Example embodiments of the inventive concept provide a packaging method capable of easily stacking a plurality of semiconductor chips.

Additional features and utilities of the present general inventive concept will be set forth in part in the description which follows and, in part, will be obvious from the description, or may be learned by practice of the general inventive concept.

According to example embodiments of the inventive concept, a method of fabricating a semiconductor package includes mounting a lower stack including a plurality of lower semiconductor chips on a substrate, forming a lower mold layer on the substrate to enclose a side surface of the lower stack and expose a top surface of the lower stack, and mounting an upper stack including a plurality of upper semiconductor chips on the lower stack having the side surface enclosed by the lower mold layer.

In example embodiments, the mounting of the lower stack may include providing lower solder balls on a bottom surface of the lower stack, and performing a reflow process to a structure with the lower solder balls to form lower connecting portions that are disposed between the substrate and the lower stack and are electrically connected to the substrate.

In example embodiments, the mounting of the upper stack may include providing upper solder balls on a bottom surface of the upper stack, and performing a reflow process to a structure with the upper solder balls to form upper connecting portions between the upper stack and the lower stack.

In example embodiments, the lower mold layer may be formed to fill gap regions between the substrate and the lower stack and between the lower semiconductor chips.

In example embodiments, the method may further include forming an upper mold layer to cover the lower mold layer, the lower stack, and the upper stack.

In example embodiments, the upper mold layer may be formed to fill gap regions between the lower and upper stack and between the upper semiconductor chips.

In example embodiments, the upper mold layer may include a different material from the lower mold layer.

In example embodiments, the lower mold layer may be formed in such a way that an uppermost surface thereof is coplanar with or lower than a top surface of the lower stack.

In example embodiments, the forming of the lower stack may include preparing a first semiconductor substrate, on which a first semiconductor chip formed with first through vias is provided, mounting a second semiconductor chip with second through vias, on the first semiconductor chip of the first semiconductor substrate, and performing a separation process to the first semiconductor substrate to form the lower stack including the first and second semiconductor chips that are sequentially stacked.

In example embodiments, the upper stack may include third and fourth semiconductor chips that are sequentially stacked, and the third semiconductor chip may include third through vias penetrating the third semiconductor chip.

According to example embodiments of the inventive concept, a semiconductor package may include a substrate, first, second, third, and fourth semiconductor chips sequentially stacked on the substrate, a lower mold layer disposed on the substrate to enclose side surfaces of the first and second semiconductor chips, an uppermost surface of the lower mold layer being positioned at a level lower than a top surface of the second semiconductor chip, and an upper mold layer covering the lower mold layer and the third and fourth semiconductor chips and including a different material from the lower mold layer.

In example embodiments, the lower mold layer may be provided to fill gap regions between the substrate and the first semiconductor chip and between the first and second semiconductor chips.

In example embodiments, the upper mold layer may be provided to fill gap regions between the second and third semiconductor chips and between the third and fourth semiconductor chips.

In example embodiments, a mean diameter of filler particles contained in the lower mold layer may be smaller than that in the upper mold layer.

According to example embodiments of the inventive concept, a method of fabricating a semiconductor package includes: forming a first mold layer between a substrate and a first stack of semiconductor chips mounted thereon and along sides of the first stack such that a top surface of the first stack is exposed to mount a second stack of semiconductor chips; and forming a second mold layer underneath and along sides of the second stack such that a top surface of the second stack is exposed to mount another semiconductor chip stack.

In an exemplary embodiment, the mounting of the first stack on the substrate comprises: providing lower solder balls on a bottom surface of the first stack; and performing a reflow process to the lower solder balls to form lower connecting portions that are disposed between the substrate and the first stack and are electrically connected to the substrate In an exemplary embodiment, the mounting of the second stack comprises: providing upper solder balls on a bottom of each additional stack; and performing a reflow process on the upper solder balls to form upper connecting portions between the second stack and the first stack.

In an exemplary embodiment, the second mold layer covers the first layer, the first stack, and the second stack.

In an exemplary embodiment, at least one of the mold layers comprise a different material from the other mold layers.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE PREFERRED EMBODIMENTS

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 7 are sectional views illustrating a method of fabricating a semiconductor package, according to example embodiments of the inventive concept.

Figure 1:
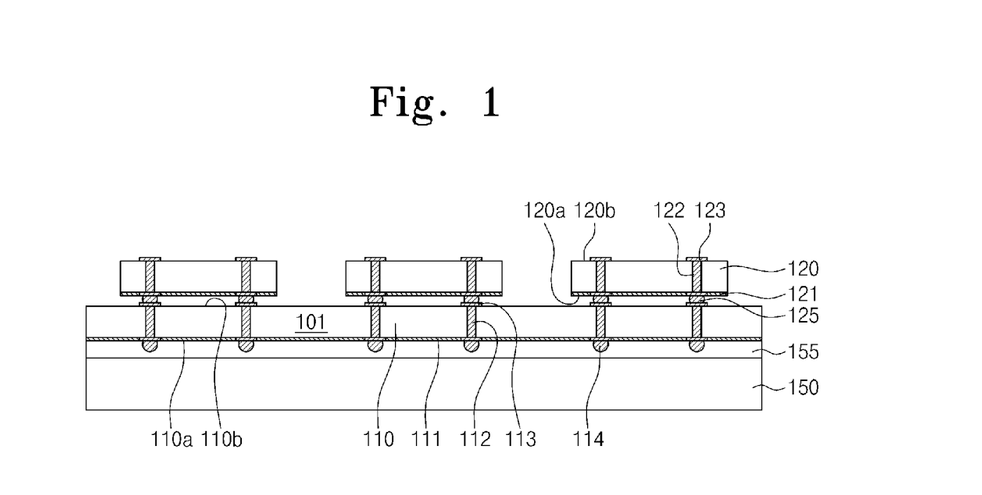
FIGS. 1 through 7 are sectional views illustrating a method of fabricating a semiconductor package, according to example embodiments of the inventive concept.

Referring to FIG. 1, a first semiconductor chip 110 and a second semiconductor chip 120 may be sequentially stacked on a carrier substrate 150. The second semiconductor chip 120 may be mounted on the first semiconductor chip 110 in a chip-on-wafer (COW) manner. For example, a first semiconductor substrate 101 including one or more first semiconductor chips 110 may be attached on the carrier substrate 150 using a carrier adhesive layer 155. The first semiconductor substrate 101 may be a wafer-level semiconductor substrate made of a semiconductor (e.g., silicon). The first semiconductor chip 110 may include a first integrated circuit layer 111 and first through vias 112. The first integrated circuit layer 111 may be formed on a bottom surface 110a of the first semiconductor chip 110. The first integrated circuit layer 111 may include at least one of memory circuits, logic circuits, or any combination thereof. The first through vias 112 may penetrate the first semiconductor chip 110 and be electrically connected to the first integrated circuit layer 111. Lower solder balls 114 may be provided on the bottom surface 110a of the first semiconductor chip 110 and be electrically connected to the first through vias 112. First upper pads 113 may be provided on a top surface 110b of the first semiconductor chip 110 and be electrically connected to the first through vias 112.

The second semiconductor chip 120 may be mounted on the first semiconductor chip 110 of the first semiconductor substrate 101, and thus, a chip-on-wafer (COW) structure may be formed. Further, second through vias 122 may be provided to penetrate the second semiconductor chip 120. A second integrated circuit layer 121 may be provided on a bottom surface 120a of the second semiconductor chip 120. Second upper pads 123 may be provided on a top surface 120b of the second semiconductor chip 120 and be electrically connected to the second through vias 122. Solders (not shown) may be provided on the bottom surface 120a of the second semiconductor chip 120, and then, a reflow process may be performed to form lower bump portions 125 electrically connected to the first upper pads 113. The lower bump portions 125 may be formed between the first and second semiconductor chips 110 and 120. In the reflow process, any additional pressure may not be applied to the first and second semiconductor chips 110 and 120, and this makes it possible to prevent the first and second semiconductor chips 110 and 120 from being damaged. The second semiconductor chip 120 may be electrically connected to the first semiconductor chip 110 through the lower bump portions 125. Here, if the first semiconductor chip 110 is a failed one, the second semiconductor chip 120 may not be mounted thereon.

Figure 2:
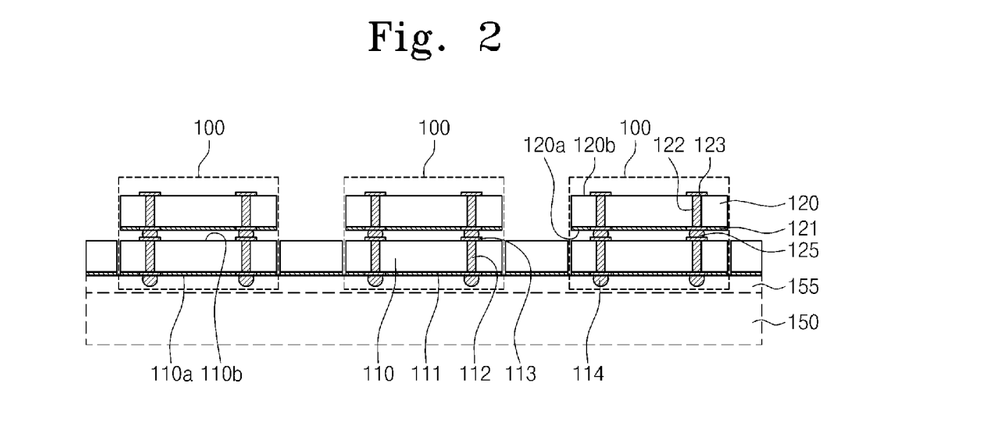

Referring to FIG. 2, at least one lower stack 100 may be separated from the first semiconductor substrate 101. The separation of the lower stack 100 may include dicing the first semiconductor substrate 101. The lower stack 100 may include a plurality of stacked lower semiconductor chips (for example, a stack of the first and second semiconductor chips 110 and 120). In certain embodiments, before the separation of the lower stack 100, the carrier substrate 150 and the carrier adhesive layer 155 may be removed from the first semiconductor chip 110.

Figure 3:
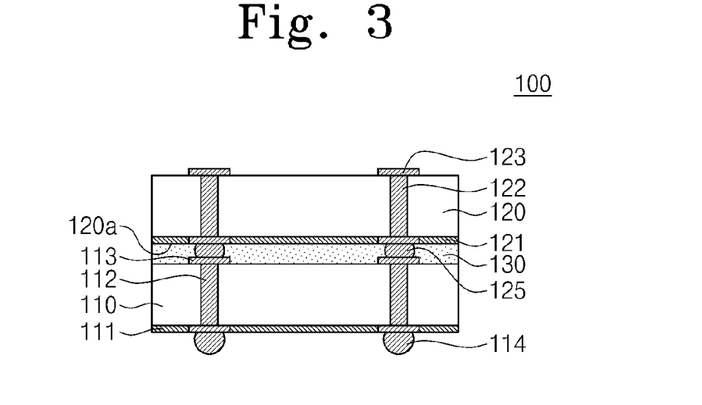

FIG. 3 is a sectional view illustrating a lower stack fabricated by a method according to other example embodiments of the inventive concept. For the sake of brevity, the elements and features of this example that are similar to those previously shown and described will not be described in much further detail.

Referring to FIG. 3 in conjunction with FIG. 2, the lower stack 100 may include a stack of the lower semiconductor chips 110 and 120. The first and second semiconductor chips 110 and 120 may be configured to have the same features as those in the previous embodiments described with reference to FIG. 1. An adhesive layer 130 may be interposed between the first and second semiconductor chips 110 and 120 to enclose the lower bump portions 125. For example, referring back to FIG. 2, the adhesive layer 130 may be formed between the first upper pads 113 on the first semiconductor chip 110, and then, the second semiconductor chip 120 may be attached on the first upper pads 113 and the adhesive layer 130. Alternatively, the adhesive layer 130 may be formed on the bottom surface 120a of the second semiconductor chip 120 and between solders (not shown), and then, the second semiconductor chip 120 including the adhesive layer 130 and the solders (not shown) may be mounted on the first semiconductor chip 110. When the second semiconductor chip 120 is mounted on the first semiconductor chip 110, it is possible to prevent the lower bump portions 125 from being damaged, due to the presence of the adhesive layer 130. Further, due to the presence of the adhesive layer 130, it is possible to improve uniformity in space between the first and second semiconductor chips 110 and 120.

Figure 4:
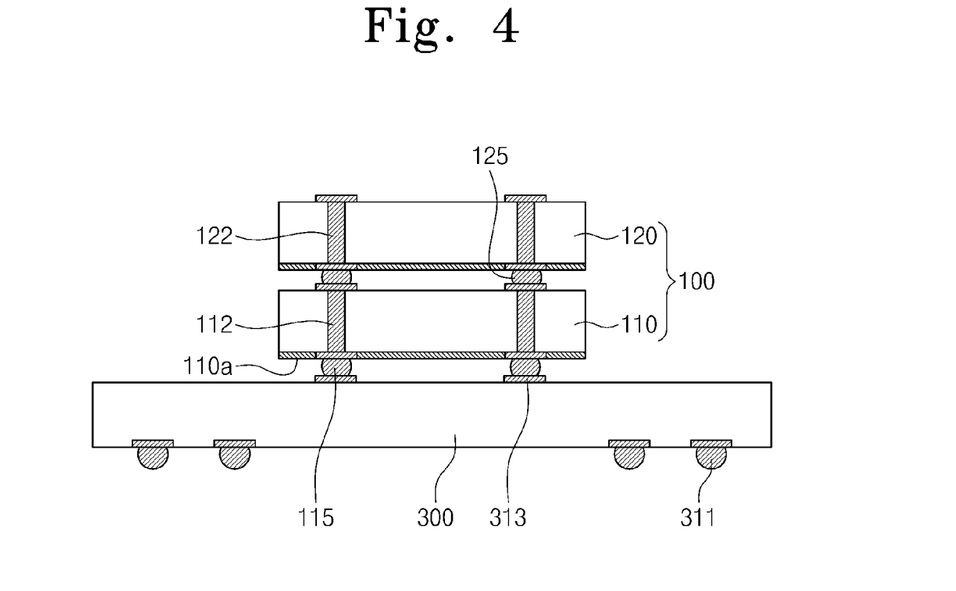

Referring to FIG. 4, the lower stack 100 including a plurality of semiconductor chips (e.g., the first and second semiconductor chips 110 and 120) may be mounted on a substrate 300. The substrate 300 may be a package substrate (e.g., a printed circuit board (PCB)). Outer connection terminals 311 may be provided on a bottom surface of the substrate 300. The lower stack 100 may be configured to have the same features as that of the previous embodiments described with reference to FIGS. 1 and 2. For example, the lower stack 100 may include a stack of the first and second semiconductor chips 110 and 120. The first semiconductor chip 110 may be disposed on the substrate 300 in such a way that the lower solder balls (e.g., 114 of FIG. 2) on the bottom surface 110a of the first semiconductor chip 110 are in contact with substrate pads 313. A reflow process may be performed to a structure with the lower solder balls 114, and thus, lower connecting portions 115 may be formed between the substrate 300 and the first semiconductor chip 110. The first semiconductor chip 110 may be electrically connected to the substrate 300 via the lower connecting portions 115. In the reflow process, any additional pressure may not be applied to the first and second semiconductor chips 110 and 120. In certain embodiments, the lower stack 100 may be configured to have the same features as that of the previous embodiments described with reference to FIG. 3.

Figure 5:
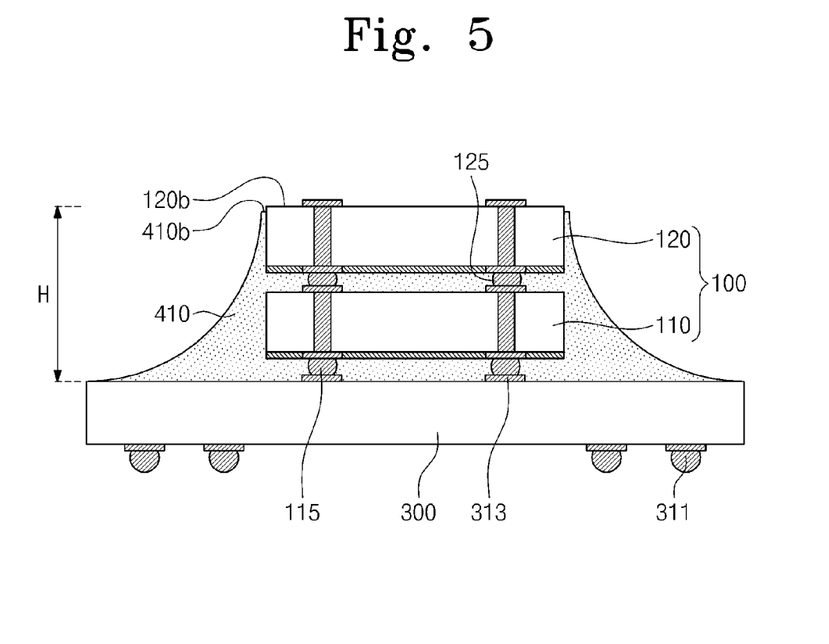

Referring to FIG. 5, a lower mold layer 410 may be formed on the substrate 300 to enclose a side surface of the lower stack 100. For example, the lower mold layer 410 may be formed to cover side surfaces of the first and second semiconductor chips 110 and 120. The lower mold layer 410 may include conductive filler particles and an insulating polymer (e.g., an epoxy molding compound). An uppermost surface 410b of the lower mold layer 410 may be positioned at a level that is the same as or lower than the lower stack 100 or the top surface 120b of the second semiconductor chip 120. For example, the lower mold layer 410 may be formed not to cover the top surface 120b of the second semiconductor chip 120. The lower mold layer 410 may be formed to fill gap regions between the substrate 300 and the first semiconductor chip 110 and between the first and second semiconductor chips 110 and 120. For example, the lower mold layer 410 may be provided between the lower connecting portions 115 and between the lower bump portions 125. Accordingly, it is unnecessary to form an additional under fill layer (not shown) between the substrate 300 and the first semiconductor chip 110 and between the first and second semiconductor chips 110 and 120. In other words, it is possible to encapsulate the lower stack 100 with ease. In the case where the lower stack 100 has a small thickness (for example, the lower stack 100 includes one lower semiconductor chip), the lower mold layer 410 may fill a gap region between the substrate 300 and the lower stack 100 and cover the top surface of the lower stack 100. According to example embodiments of the inventive concept, since the lower stack 100 includes a plurality of semiconductor chips (e.g., 110 and 120), the lower stack 100 may have a sufficiently large thickness H to prevent the lower mold layer 410 from covering the top surface of the lower stack 100 (for example, the top surface 120b of the second semiconductor chip 120). For example, the lower stack 100 may have a thickness H of about 100 μm or larger. Alternatively, stacks (not shown) may be repeatedly mounted on the lower stack 100 enclosed by the lower mold layer 410, using the method described with reference to FIG. 4. Accordingly, it is easy to form the stack including more than two semiconductor chips (e.g., 110 and 120).

Figure 6:
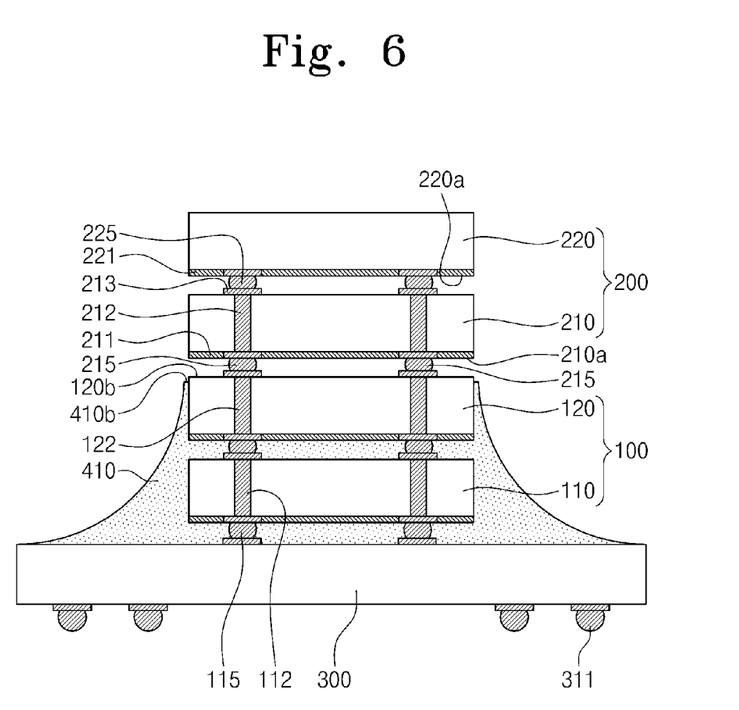

Referring to FIG. 6, an upper stack 200 may be mounted on the lower stack 100. The upper stack 200 may be fabricated using a method that is the same as or similar to those for forming the lower stack 100 of FIGS. 1 and 2. For example, a fourth semiconductor chip 220 may be mounted on each third semiconductor chip 210 of the semiconductor substrate (not shown), and thus, a chip-on-wafer (COW) structure may be formed. Solders (not shown) may be provided on a bottom surface 220a of the fourth semiconductor chip 220, and then, a reflow process may be performed to a structure with the solders to form upper bump portions 225 between the third and fourth semiconductor chips 210 and 220. The upper bump portions 225 may be electrically connected to third upper pads 213. The upper stack 200 can be fabricated by, for example, dicing the semiconductor substrate (not shown). The upper stack 200 may include the third and fourth semiconductor chips 210 and 220 sequentially stacked. The third semiconductor chip 210 may include a third integrated circuit layer 211 and third through vias 212 penetrating the third semiconductor chip 210. The fourth semiconductor chip 220 may include a fourth integrated circuit layer 221. In other example embodiments, the upper stack 200 may further include an adhesive layer (not shown) interposed between the third and fourth semiconductor chips 210 and 220, like the lower stack 100 of FIG. 3. In still other example embodiments, after the mounting of the fourth semiconductor chip 220, an under fill layer (not shown) may be further formed between the third and fourth semiconductor chips 210 and 220.

Lower solder balls (not shown) may be provided on a bottom surface 210a of the third semiconductor chip 210, and then, a reflow process may be performed to the structure with the lower solder balls. Accordingly, upper connecting portions 215 may be formed between the upper and lower stacks 200 and 100. The third semiconductor chip 210 may be electrically connected to the second semiconductor chip 120 via the upper connecting portions 215. In the case where the lower mold layer 410 covers the top surface of the lower stack 100 (for example, the top surface 120b of the second semiconductor chip 120), it may be difficult to mount the upper stack 200 on the second semiconductor chip 120. However, according to example embodiments of the inventive concept, an uppermost surface 410b of the lower mold layer 410 may be positioned at a level that is the same as or lower than the top surface 120b of the second semiconductor chip 120, and thus, the upper stack 200 can be easily mounted on the second semiconductor chip 120.

Figure 7:
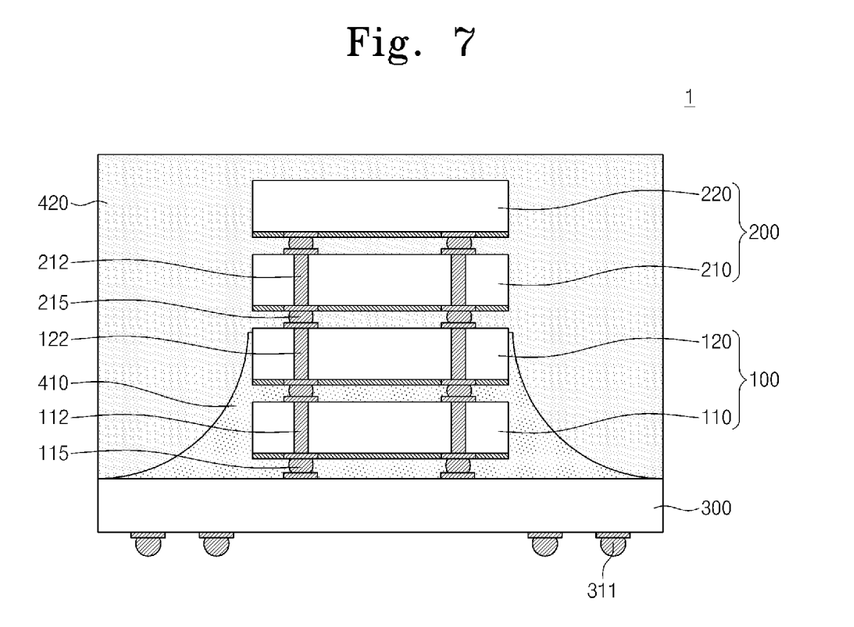

Referring to FIG. 7, an upper mold layer 420 may be formed to cover the substrate 300, the lower mold layer 410, the lower stack 100, and the upper stack 200. The upper mold layer 420 may be formed to fill gap regions between the second and third semiconductor chips 120 and 210 and between the third and fourth semiconductor chips 210 and 220. Accordingly, it is possible to omit a process of forming additional under fill layers between the second and third semiconductor chips 120 and 210 and between the third and fourth semiconductor chips 210 and 220, and thus, this makes it possible to simplify the fabrication of the semiconductor package 1. The upper mold layer 420 may include conductive filler particles and an insulating polymer material (e.g., an epoxy molding compound). A mean diameter of the conductive filler particles may be larger in the upper mold layer 420 than in the lower mold layer 410.

APPLICATIONS

Figure 8:
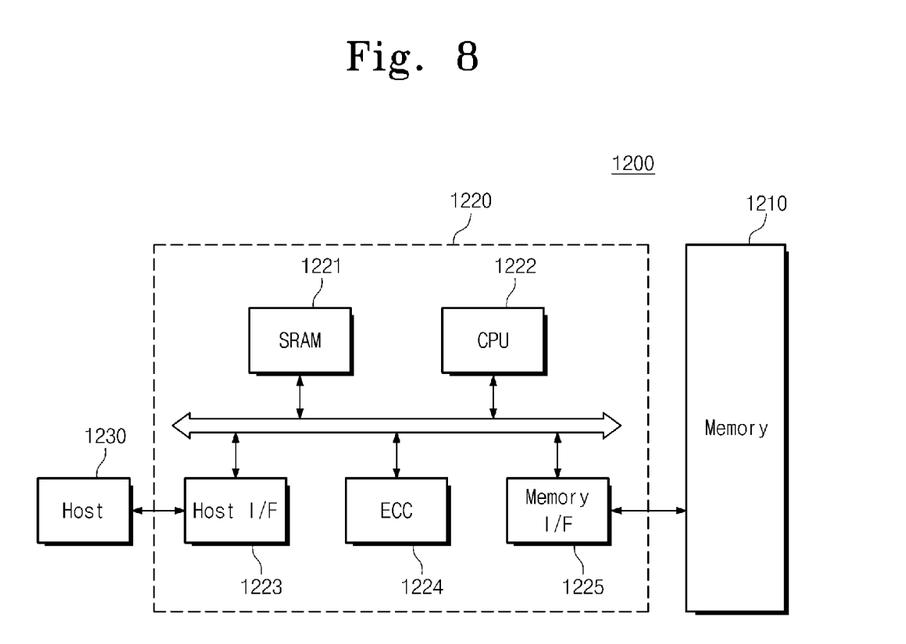
FIG. 8 is a block diagram illustrating a memory card including the semiconductor packages according to example embodiments of the inventive concept.
Figure 9:
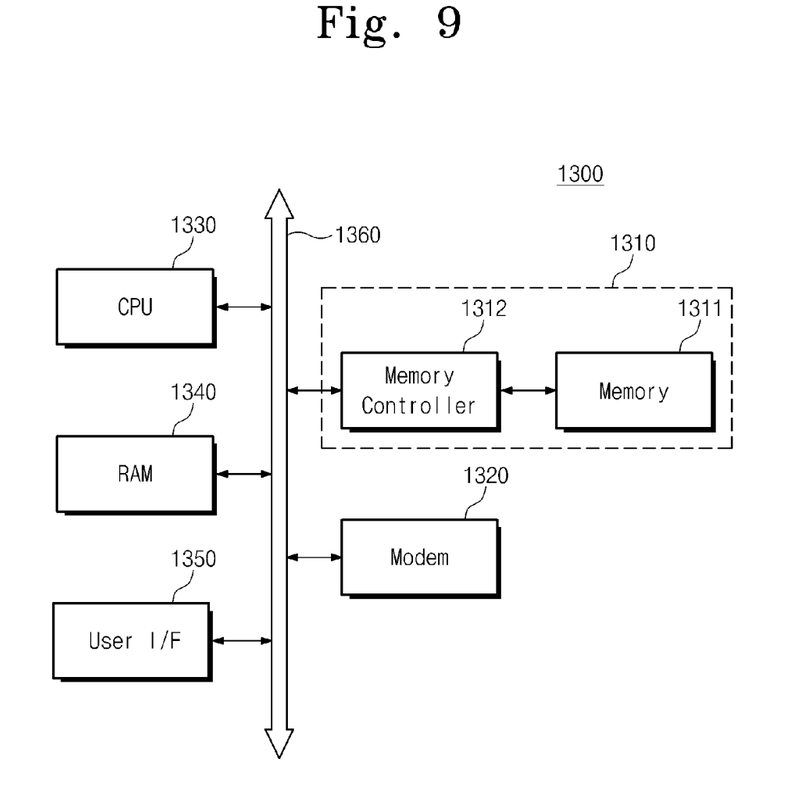
FIG. 9 is a block diagram illustrating an information processing system including the semiconductor packages according to example embodiments of the inventive concept.

FIG. 8 is a block diagram illustrating a memory card including the semiconductor packages according to example embodiments of the inventive concept. FIG. 9 is a block diagram illustrating an information processing system including the semiconductor packages according to example embodiments of the inventive concept.

Referring to FIG. 8, a memory card 1200 may include a host 1230, a memory device 1210, and a memory controller 1220 controlling data exchanges therebetween. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. The processing unit 1222 may perform general control operations for data exchange of the memory controller 1220. The memory device 1210 may include at least one of the semiconductor packages 1 according to example embodiments of the inventive concept.

Referring to FIG. 9, an information processing system 1300 may be realized using a memory system 1310 including at least one of the semiconductor packages 1 according to example embodiments of the inventive concept. For instance, the information processing system 1300 may be a mobile device and/or a computer. In example embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identical to the memory card 1200 described with respect to FIG. 8. Data processed by the CPU 1330 and/or input from the outside may be stored in the memory system 1310. In certain embodiments, the information processing system 1300 may further include or be, for example, an application chipset, a camera image sensor, a camera image signal processor (ISP), an input/output device, or the like.

According to example embodiments of the inventive concept, each of stacks may include a plurality of semiconductor chips and a reflow process may be used to mount the stacks. A lower stack may include a plurality of lower semiconductor chips, and thus, a lower mold layer can be formed not to cover a top surface of the lower stack. Accordingly, an upper stack can be mounted on the top surface of the lower stack. The lower mold layer may be formed to fill gap regions between the substrate and the lower stack and between the lower semiconductor chips, and thus, it is unnecessary to form an additional under fill layer. An upper mold layer may be formed to fill gap regions between the upper and lower stacks and the upper semiconductor chips. Accordingly, a semiconductor package (for example, including at least four stacked semiconductor chips) can be easily fabricated.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of fabricating a semiconductor package, comprising:
stacking a plurality of lower semiconductor chips to form a lower stack;
mounting the lower stack on a substrate;

forming a lower mold layer on the substrate to enclose a side surface of the lower stack and to expose a top surface of the lower stack;

mounting an upper stack including a plurality of upper semiconductor chips on the lower stack having the side surface enclosed by the lower mold layer; wherein the mounting of the lower stack comprises providing lower solder balls on a bottom surface of the lower stack and performing a reflow process to a structure with the lower solder balls to form lower connecting portions that are disposed between the substrate and the lower stack and are electrically connected to the substrate; and wherein the forming of the lower stack comprises preparing a first semiconductor substrate, on which a first semiconductor chip formed with first through vias is provided; mounting a second semiconductor chip with second through vias, on the first semiconductor chip of the first semiconductor substrate; and performing a separation process to the first semiconductor substrate to form the lower stack including the first and second semiconductor chips that are sequentially stacked.

2. The method of claim 1, wherein the mounting of the upper stack comprises:

providing upper solder balls on a bottom surface of the upper stack; and performing a reflow process to a structure with the upper solder balls to form upper connecting portions between the upper stack and the lower stack.

3. The method of claim 1, wherein the lower mold layer is formed to fill gap regions between the substrate and the lower stack and between the lower semiconductor chips.

4. The method of claim 1, further comprising forming an upper mold layer to cover the lower mold layer, the lower stack, and the upper stack.

5. The method of claim 4, wherein the upper mold layer is formed to fill gap regions between the lower and upper stack and between the upper semiconductor chips.

6. The method of claim 4, wherein the upper mold layer comprises a different material from the lower mold layer.

7. The method of claim 1, wherein the lower mold layer is formed in such a way that an uppermost surface thereof is coplanar with or lower than a top surface of the lower stack.

8. The method of claim 1, wherein the upper stack comprises third and fourth semiconductor chips that are sequentially stacked, and the third semiconductor chip comprises third through vias penetrating the third semiconductor chip.

9. A method of fabricating a semiconductor package, comprising:

forming a first mold layer between a substrate and a first stack of semiconductor chips mounted thereon and along sides of the first stack such that a top surface of the first stack is exposed to mount a second stack of semiconductor chips thereon;

forming a second mold layer underneath and along sides of the mounted second stack such that a top surface of the second stack is exposed to mount another semiconductor chip stack, wherein mounting of the first stack on the substrate comprises:

providing lower solder balls on a bottom surface of the first stack; and performing a reflow process to the lower solder balls to form lower connecting portions that are disposed between the substrate and the first stack and are electrically connected to the substrate; and wherein the forming of the first stack comprises preparing a first semiconductor substrate, on which a first semiconductor chip formed with first through vias is provided; mounting a second semiconductor chip with second through vias, on the first semiconductor chip of the first semiconductor substrate; and performing a separation process to the first semiconductor substrate to form the lower stack including the first and second semiconductor chips that are sequentially stacked.

10. The method of claim 9, wherein mounting of the second stack comprises:

providing upper solder balls on a bottom of the second stack; and performing a reflow process on the upper solder balls to form upper connecting portions between the second stack and the first stack.

11. The method of claim 9, wherein second mold layer covers the first mold layer, the first stack, and the second stack.

12. The method of claim 9, wherein the first mold layer comprise a different material from the second mold layer.

13. A method of fabricating a semiconductor package, comprising:

forming a first mold layer between a substrate and a first stack of semiconductor chips mounted thereon and along sides of the first stack such that a top surface of the first stack is exposed to mount a second stack of semiconductor chips;

forming a second mold layer underneath and along sides of the mounted second stack such that a top surface of the second stack is exposed to mount another semiconductor chip stack, wherein mounting of the second stack comprises:

providing upper solder balls on a bottom of the second stack; and performing a reflow process on the upper solder balls to form upper connecting portions between the second stack and the first stack; and wherein the forming of the first stack comprises preparing a first semiconductor substrate, on which a first semiconductor chip formed with first through vias is provided; mounting a second semiconductor chip with second through vias, on the first semiconductor chip of the first semiconductor substrate; and performing a separation process to the first semiconductor substrate to form the lower stack including the first and second semiconductor chips that are sequentially stacked.

* * * * *